United States Patent
Lealman et al.

(10) Patent No.: US 6,198,863 B1
(45) Date of Patent: *Mar. 6, 2001

(54) OPTICAL FILTERS

(75) Inventors: Ian F Lealman; Michael J Robertson, both of Ipswich (GB); Makoto Okai, Kokubunji (JP)

(73) Assignees: British Telecommunications public limited company, London (GB); Hitachi Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/051,207

(22) PCT Filed: Oct. 3, 1996

(86) PCT No.: PCT/GB96/02424

§ 371 Date: Apr. 28, 1998

§ 102(e) Date: Apr. 28, 1998

(87) PCT Pub. No.: WO97/14201

PCT Pub. Date: Apr. 17, 1997

Related U.S. Application Data

(63) Continuation-in-part of application No. 08/638,757, filed on Apr. 29, 1996, now Pat. No. 5,699,378.

(30) Foreign Application Priority Data

Oct. 6, 1996 (EP) .................................................. 95307107

(51) Int. Cl.[7] ...................................................... G02B 6/34

(52) U.S. Cl. ................................ 385/37; 372/45; 372/102

(58) Field of Search ................................. 385/15, 31, 37, 385/25, 129, 131, 132; 372/45, 46, 92, 96, 99, 102

(56) References Cited

U.S. PATENT DOCUMENTS

| | | |
|---|---|---|
| 4,869,567 * | 9/1989 | Millar ................................ 350/96.15 |
| 5,077,816 | 12/1991 | Glomb et al. . |
| 5,170,290 | 12/1992 | Land et al. . |
| 5,225,930 | 7/1993 | Land et al. . |
| 5,237,576 | 8/1993 | DiGiovanni et al. . |

(List continued on next page.)

FOREIGN PATENT DOCUMENTS

| | | |
|---|---|---|
| 0 559 192 | 9/1993 | (EP) . |
| 2 269 679 | 2/1994 | (GB) . |
| 1-054790 | 2/1989 | (JP) . |
| 1-238181 | 9/1989 | (JP) . |
| 93 17363 | 9/1993 | (NL) . |

OTHER PUBLICATIONS

IEEE Journal of Quantum Electronics, vol. 29, No. 6, Jun. 1, 1993, pp. 1824–1834, Jayaraman et al, "Theory Design, and Performance of Extended Tuning Range Semiconductor Lasers with Sampled Gratings".

IEEE Photonics Technology Letters, vol. 4, No. 12, Dec. 1, 1992, pp. 1386–1389, Nolting et al, "Eigenmode Matching and Propagation Theory of Square Meander–Type Couplers".

*Primary Examiner*—Teresa M. Arroyo
*Assistant Examiner*—Gioacchino Inzirillo
(74) *Attorney, Agent, or Firm*—Nixon & Vanderhye P.C.

(57) ABSTRACT

An optical filter is formed from at least two grating located in a waveguide region of a semiconductor optical device. Each grating has a multiple peak optical passband. The gratings are spaced apart in the waveguide region and form an optical cavity having a comb-filter characteristic. The gratings may be located in the active region of an optical gain element and in a preferred example are superstructure gratings (SSGs). A number of filters may be joined together in series.

18 Claims, 11 Drawing Sheets

U.S. PATENT DOCUMENTS

| | | |
|---|---|---|
| 5,257,273 | 10/1993 | Farries et al. . |
| 5,305,335 | 4/1994 | Ball et al. . |
| 5,317,576 | 5/1994 | Leonberger et al. . |
| 5,323,404 | 6/1994 | Grubb . |
| 5,455,835 | 10/1995 | Atkins et al. . |
| 5,561,675 | 10/1996 | Bayon et al. . |
| 5,600,665 | 2/1997 | Minden et al. . |
| 5,699,378 * | 12/1997 | Lealman ............................. 372/102 |
| 5,796,891 * | 8/1998 | Poustie ................................ 385/28 |

* cited by examiner

OPTICAL FILTERS

RELATED APPLICATIONS

This is a continuation-in-part of our earlier application Ser. No. 08/638,757 filed Apr. 29, 1996, now U.S. Pat. No. 5,699,378. This application is also a US national phase under 35 U.S.C. §371 of PCT/GB96/02424 filed Oct. 3, 1996.

BACKGROUND OF THE INVENTION

1. Field of the Invention

The present invention relates to optical filters, and to optical sources incorporating such filters. In particular it relates to tunable filters and sources suitable for us, for example, in optical networks employing wavelength division multiplexing (WDM).

2. Related Art

The use of WDM and wavelength routing in optical networks has been proposed to provide the increased bandwidth required, for example, for the provision of multimedia services. Tunable lasers and filters are essential components for the implementation of such systems and desirably should provide tuning ranges of around 40 nm to allow complete coverage of the erbium amplifier transmission window around 1550 nm, for example.

It has previously been proposed to use a distributed Bragg reflector laser (DBR) as a tunable source [Oeberg M et al., "Complete single mode wavelength coverage over 40 nm with a super structure grating DBR laser" 14th Semi. Laser Conf. Proceedings, 1994, pp32–33]. While a tuning range as broad as 40 nm has been claimed for such a device, it has the disadvantages of being complicated to fabricate and to control. Achieving the broad tuning range requires adjustment of control currents in both the superstructure grating (SSG) and in a phase control section of the laser.

Another approach is the use of a laser with a grating-assisted vertically-coupled filter (GAVCF). The paper by Kim I., et al., "Broadly tunable vertical-coupler filter tensile-strained InGaAs/InGaAsP multiple quantum well laser", Appl. Phys. Lett., 1994, 64, (21), pp2764–2766, discloses one such device. Although a tuning range of 70 nm is claimed, and only one control current is required, the device is not able to cover all wavelengths but hops between longitudinal modes of the laser cavity.

SUMMARY OF THE INVENTION

According to a first aspect of the present invention there is provided an optical filter characterised by at least two gratings located in a waveguide region of a semiconductor optical device, each grating having a multiple peak optical passband and the gratings being spaced apart in the waveguide region and forming an optical cavity having a transmission comb-filter characteristic.

The first aspect of the present invention provides a filter particularly suitable for use in a semiconductor laser, but also capable of other uses, for example as a wavelength selective channel filter. The filter, termed by the inventors as "in-line Fabry Perot" (ILFP) adopts a novel structure in which a pair of gratings are spaced apart within a waveguide region of an optical semiconductor device. As described in further detail below this structure functions as a Fabry Perot filter and has a response comprising a comb of equally spaced wavelengths which can be tuned over a relatively narrow range of less than 1 nm. By contrast with conventional Fabry Perot filters, the filter of the present invention does not require cleaved mirror facets and so is much easier to integrate monolithically with other devices. In particular, the in-line filter may be combined with a GAVCF to provide a device having an overall response which is widely tunable over specified wavelengths, which requires only a single control current, and which remains single-moded over substantially all of its range.

Preferably the gratings are superstructure gratings (SSG's).

Although other filter types, for example sampled gratings or computer generated gratings, may be used, the use of SSG's is preferred as providing optimism efficiency. An SSG operates in a similar manner to a sampled grating, but uses a grating with a linearly chirped period to obtain a number of high peaks. In prior art systems, the peaks produced by SSG or sampled grating structures are reflection peaks. Systems embodying the present invention, by contrast, give transmission peaks. A linearly chirped grating has a period which changes in a number of equal steps from a start period $\Lambda_a$ to an end period $\Lambda_b$, where the start period may be greater than or less than the end period. Alternatively, since it is difficult to fabricate a grating with a linearly chirped period, this may be approximated using a fixed period grating with a number of discrete phase shifts. The term SSG as used herein encompasses a filter made in this manner, as well as a filter with a truly linearly chirped period.

Preferably the semiconductor optical device includes an optical gain element and the gratings are spaced apart within a single continuous active region of the optical gain element.

The in-line filter of the present invention may with advantage be integrated within an active device such as a semiconductor laser to provide a compact and tunable optical source.

According to a second aspect of the present invention, there is provided a filter system comprising a plurality of filters in accordance with the first aspect of the invention coupled in series along the waveguide region with a phase discontinuity at the interface between the filters.

Here, as elsewhere in the present specification, "phase" or "period" denotes the spatial phase or period of a grating. Although an in-line filter in accordance with the first aspect of the invention can be formed from just a single pair of gratings, the present inventors have found that the characteristics of the in-line filter can be further enhanced by concatenating a number of such filters, with a phase shift at the interface between them.

Preferably the plurality of filters are arranged symmetrically about a central region of the waveguide and there is a phase shift of pi at the interface between the waveguides at the said central region. In this arrangement, when using chirped gratings, the direction of increasing frequency is the same for all the gratings throughout the system.

According to a third aspect of the present invention, there is provided a grating-assistance vertically-coupled filter (GAVCF) comprising a first waveguide region, a second waveguide region aligned with the first waveguide region and spaced apart from the first waveguide region in a first direction, and a grating associated with the second waveguide region, characterised in that the said grating is provided by a periodic variation in the width of the second waveguide in the plane normal to the said first direction.

This aspect of the present invention provides a novel structure for a GAVCF device. Conventionally, the grating in a GAVCF has been etched above, below or into the stronger waveguide. The device of the present invention, by contrast, uses a grating which is formed laterally about the waveguide. This produces a structure which is easier to fabricate and provides enhanced yields.

As noted in the introduction above, lasers incorporating a GAVCF structure can be used to provide a tunable source suitable for WDM applications. The GAVCF of the third aspect of the invention may be used in such a laser, preferably, although not necessarily, in combination with the in-line filter of the first and second aspects.

The present invention also encompasses a method of manufacturing a GAVCF in accordance with the third aspect of the present invention.

BRIEF DESCRIPTION OF THE DRAWINGS

Systems embodying the present invention will now be described in further detail, by way of example only, with reference to the accompanying drawings, in which.

DETAILED DESCRIPTION OF EXEMPLARY EMBODIMENTS

Figure 1:
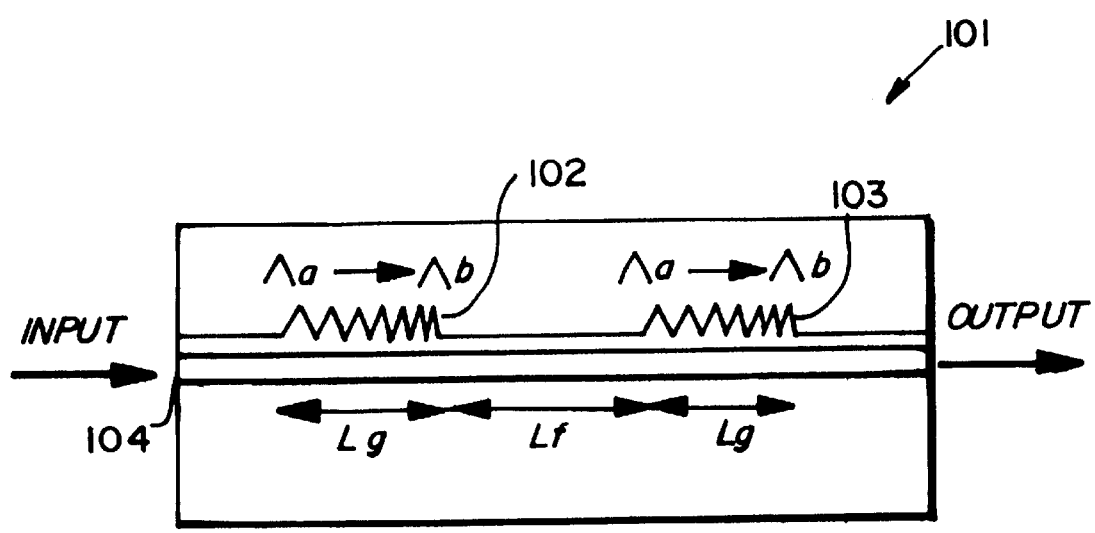
FIG. 1 is a schematic showing the structure of a Fabry-Perot filter.

As shown in FIG. 1, an optical filter 101 comprises a pair of superstructure gratings (SSG's) 102, 103, each of length $L_g$ with a flat region of length $L_f$ between them, giving a total cavity length of $L_f+2L_g$. The grating pitch changes from $\Lambda_a$ to $\Lambda_b$ to give equally spaced longitudinal modes from $\lambda$a $(=2n_{eq}\Lambda_g/n$, where $N_{eq}$ is the equivalent refractive index and n is the grating order) to $\lambda$.b $(=2n_{eq}\Lambda_b/n)$. The gratings formed on the top surface of a waveguide layer 104 using electron beam lithography. This structure termed by the invertors as In-Line Fabry-Perot (ILFP) produces a comb-filter response as seen, for example, in FIG. 3.

The dimensions, materials and process of manufacture for the filter are described in further detail below with reference to the GAVCF laser.

As an alternative to the use of a chirped grating, the filter may be constructed using a multi-phase-shifted grating [H. Ishii, Y. Tohmori, Y. Yoshikuni, T. Tamamura, and Y. Kondo, "Multiple-phase-shift super structure grating DBR lasers for broad wavelength tuning, "IEEE Photonics Technol, Lett., vol. 5, no. 6, pp. 613–615, 1993]. The phase modulation of the multi-phase-shifted grating is related to the pitch modulation of the equivalent chirped grating by:

$$\phi(z) = \pi \int \left( \frac{1}{\Lambda(z)} - \frac{1}{\Lambda_{av}} \right) dz.$$

where $\Phi(z)$ is the relative phase of the gratings, $\Lambda(z)$ is the grating pitch at position z along its length and $\Lambda$av is the averaged grating pitch. A large number of small phase-shifts gives the closest approximation to a perfect chirped grating. The present example used $\lambda/16$ (0.25π) phase-shifts because this is compatible with standard electron beam lithography processes.

Figure 2A:
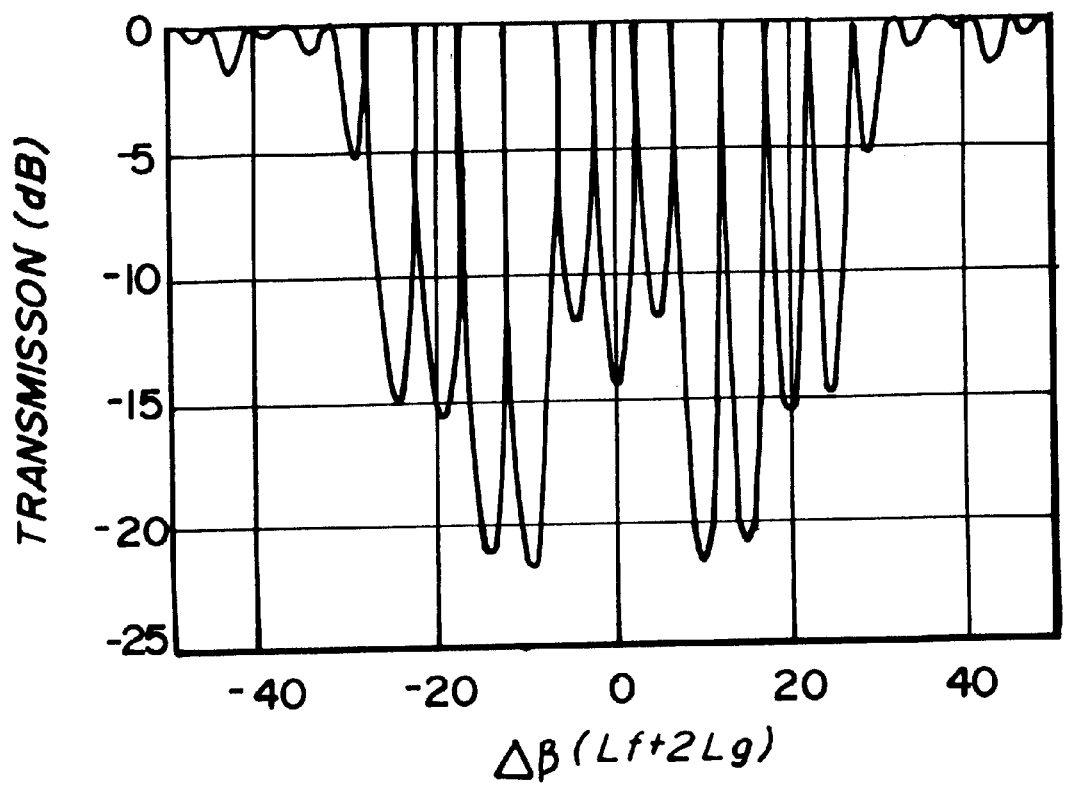
FIGS. 2a and 2b are graphs showing the calculated transmission of the filter of FIG. 1 as a function of the normalised wavenumber deviation from the Bragg condition.

The transmission spectra of the ILFP filter is calculated by the F-matrix method [M. Yamada and K. Sakuda, "Analysis of almost-periodic distributed feedback slab waveguides via a fundamental matrix approach", Appl. Optics, vol. 26, no. 16, pp 3474–3478, 1989. ]. Each grating has 12 equally spaced $\lambda/16$ (0.25π) phase shifts yielding a total phase-shift 3 π. The bandwidth of the filter is proportional to the total phase shift. Setting $L_f=L_g$ and the normalised coupling coefficient ($\kappa L_g$) to 3.0 yields a calculated transmission response with twelve uniformly spaced peaks, FIG. 2(a). The calculated transmission is plotted as a function of the normalised wavenumber deviation from the Bragg condition, $\Delta\beta(L_f°2L_g)$, where $\Delta\beta$ is the wavenumber deviation from the Bragg condition. To obtain a 1 nm spacing between each peak, a total device length $(L_f+2L_g)$ of 580 μm and a coupling coefficient κ of 155 cm$^{-1}$ are required.

Figure 2B:
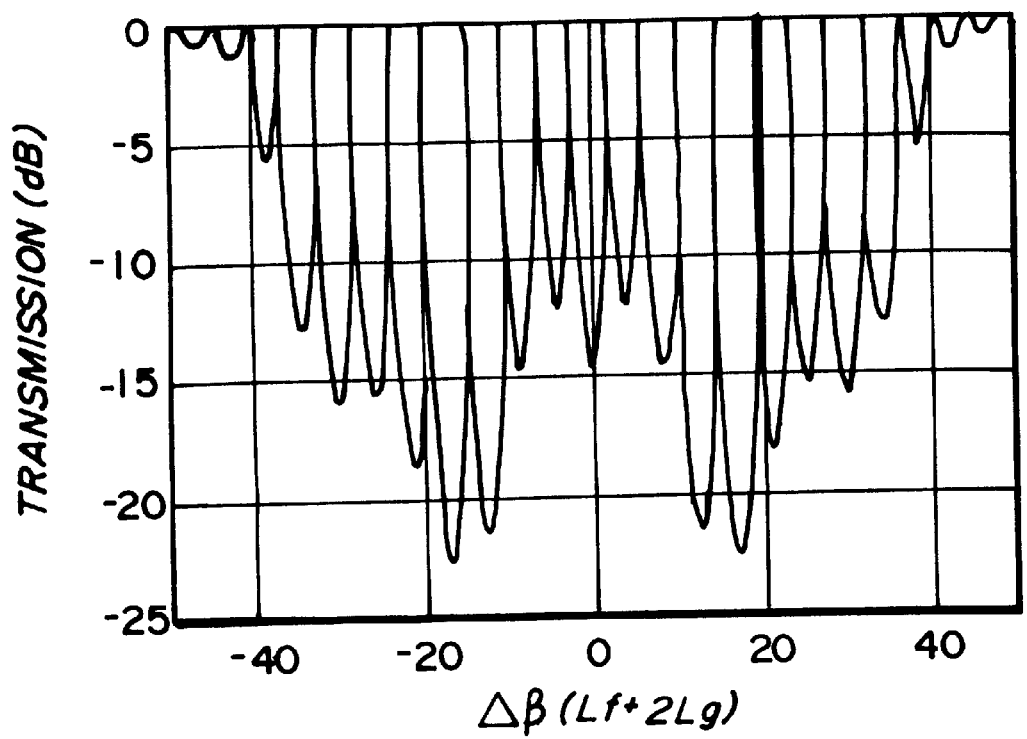

Increasing the length of the flat region increases the number of peaks. FIG. 2(b) shows the calculated transmission when $L_f$ is increased to $2L_g$. Other parameters are the same as those used in the case of FIG. 2(a). Eighteen sharp peaks are obtained with almost the same strength. To obtain a one nanometer peak spacing, a total device length $(L_f+2L_g)$ of 638 μm and a slightly larger coupling coefficient κ of 188 cm$^{-1}$ are required.

Further increasing the length of $L_f$ relative to $L_g$ gives more peaks in the transmission spectra. However the filter becomes more difficult to fabricate because of the increasing coupling coefficient. Increasing the total number of phase-shifts also increases the filter bandwidth, but makes the strength of transmission peaks non-uniform.

In one example, waveguide filter devices were fabricated using the second of the ILFP filter designs outlined above $(L_f+2L_g, \kappa L_g=3.0)$. The second order quasi-chirped gratings (the averaged grating pitch is 483.6 nm) were formed on the top surface of the waveguide layer using electron beam lithography. The InGaAsP waveguide layer (photoluminescence peak is 1.3 μm and thickness is 0.4 μm) is sandwiched by InP cladding layers. A BH structure was formed by embedding 1.0 μm wide mesa in p- and n-InP current blocking layers and overgrowing with p-InP. The total cavity length was 645 μm and the coupling coefficient κ was estimated, from the shape of the embedded grating, to be 184 cm$^{-1}$. The slice was cleaved into 1 mm long devices with 175 μm flat regions either side of the ILFP. Both cleaved facets were anti-reflection coated to reduce the reflectivity to less than 1%.

Figure 3:
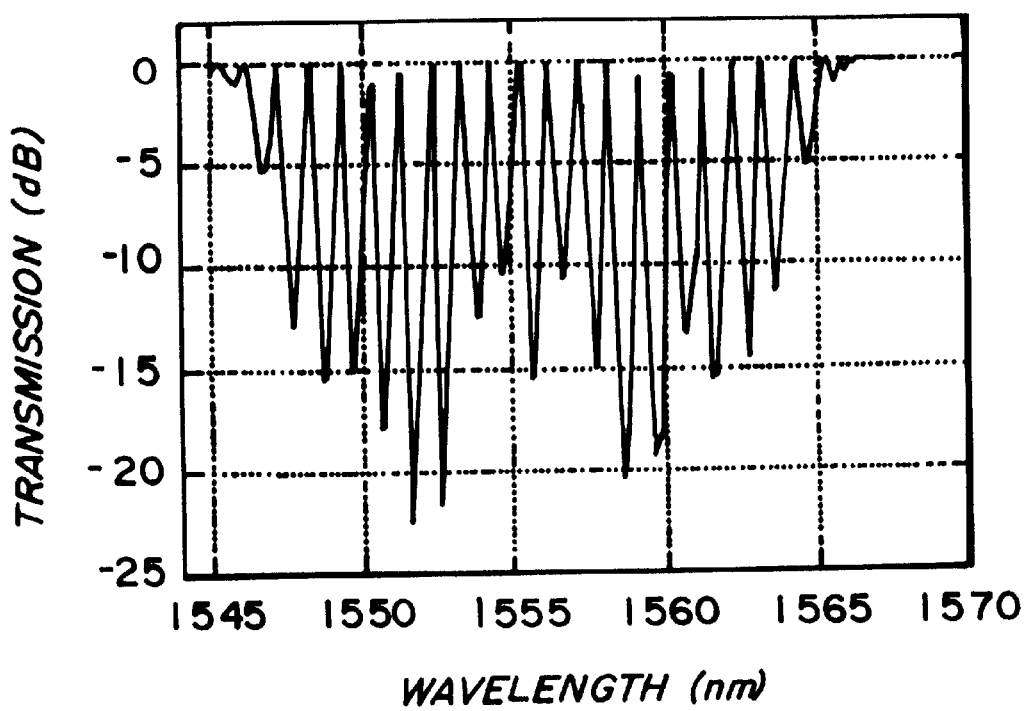
FIG. 3 is a graph showing the measured normalised transmission spectrum of the filter as a function of the wavelength.

The transmission spectrum was measured using a wavelength tunable laser as a light source. The measured normalised transmission spectrum as a function of wavelength is shown in FIG. 3. Eighteen clear 1 nm spaced transmission peaks were observed, which is in good agreement with our calculations.

Figure 4A:
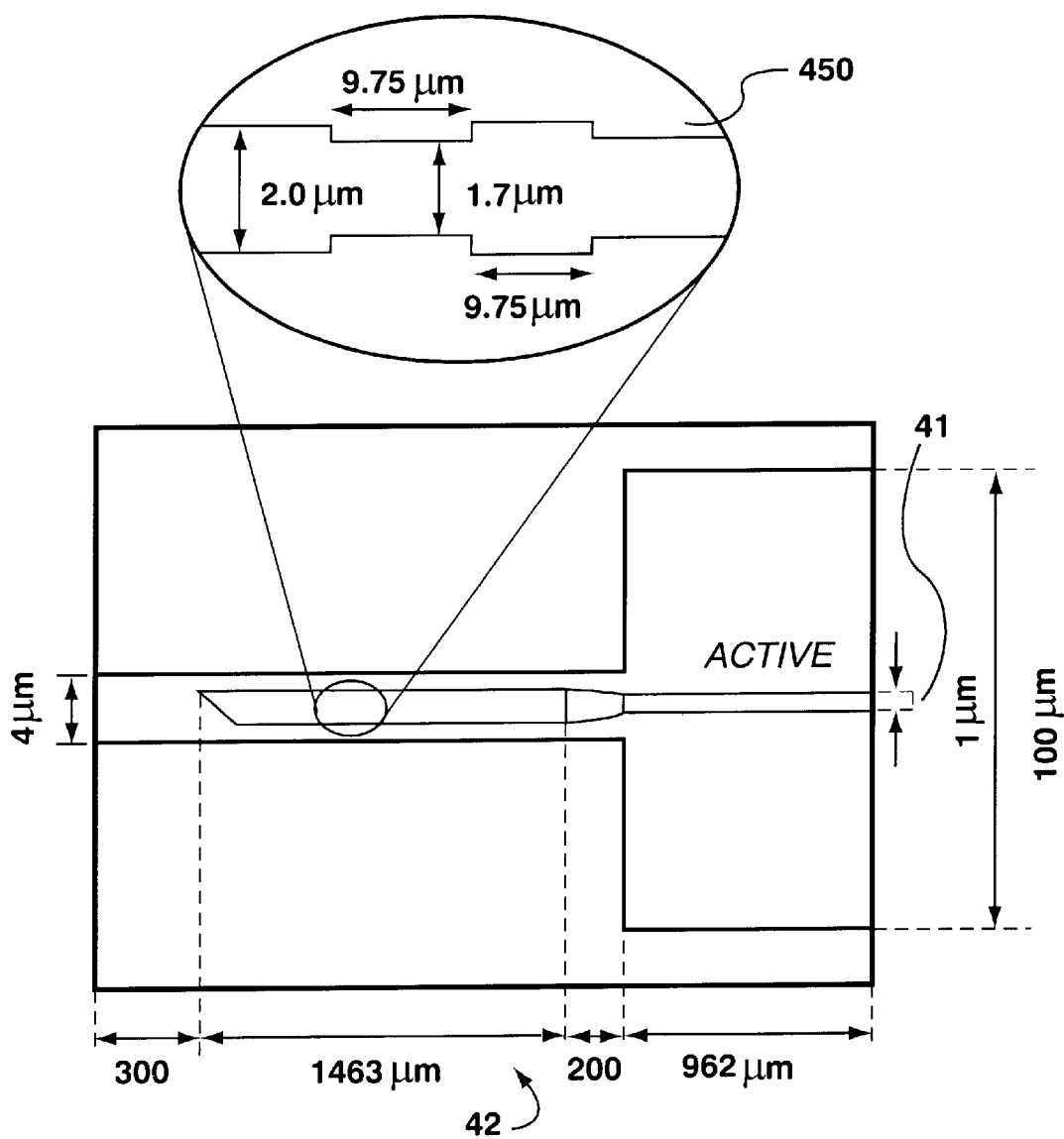
FIGS. 4a and 4b are schematics showing a plan view and a side cross section respectively of an ILFP laser incorporating a lateral graph-assisted vertical coupler filter.
Figure 4B:
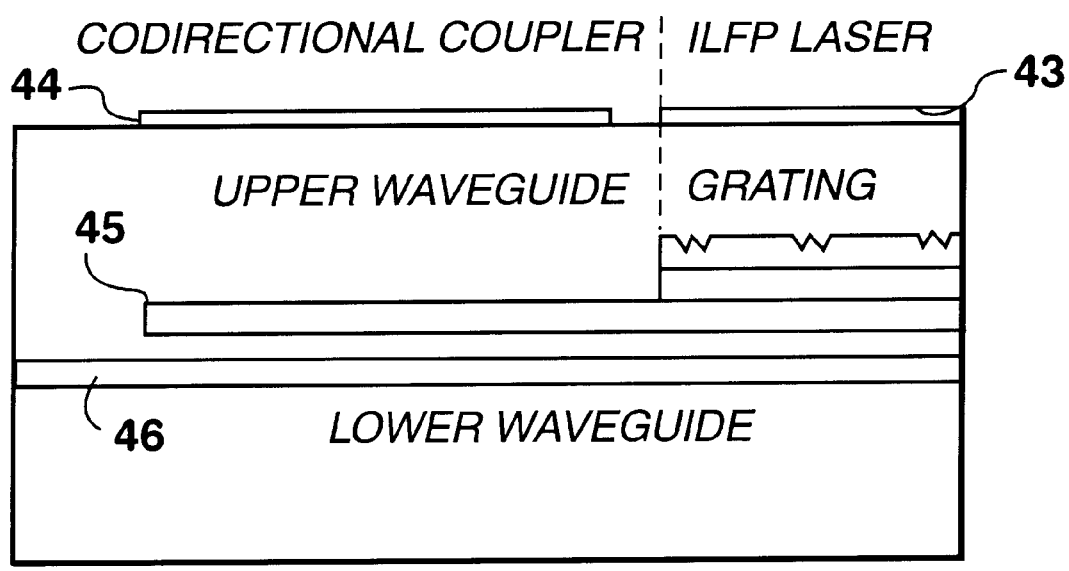

FIG. 4 shows a wavelength tunable laser incorporating a cascaded in-line Fabry-Perot filter. In this device the ILFP is integrated in the active region 41 of a semiconductor laser. The resulting ILFP laser is coupled to a GAVCF structure 42, and is controlled by the injection of control currents at gates 43, 44.

In this example, the grating of the ILFP laser provides 11 equally spaced longitudinal modes. The 962 μm long ILFP laser section 41 is coupled to the 1463 μm long GAVCF by a 200 μm long tapered region. The upper waveguide of the GAVCF is truncated approximately 250 μm short of the facet to prevent the reflection of non-filtered light through the upper waveguide. The filtered light coupled into the lower waveguide 46 is reflected at the cleaved facet and coupled again into the upper waveguide 45. This filtered light excites one of the ILFP laser's longitudinal modes and single-mode laser operation results.

The GAVCF design uses a lateral grating, as described in further detail below. The ILFP laser in this example has an MQW active layer of 8.7-nm thick wells with 1.0% compressive strain and 14 nm thick barriers with 0.5% tensile strain for strain compensation. The grating is etched in a 0.2 μm thick 1.3 μm-wavelength quaternary layer above the MQW active layer.

Figure 5A:
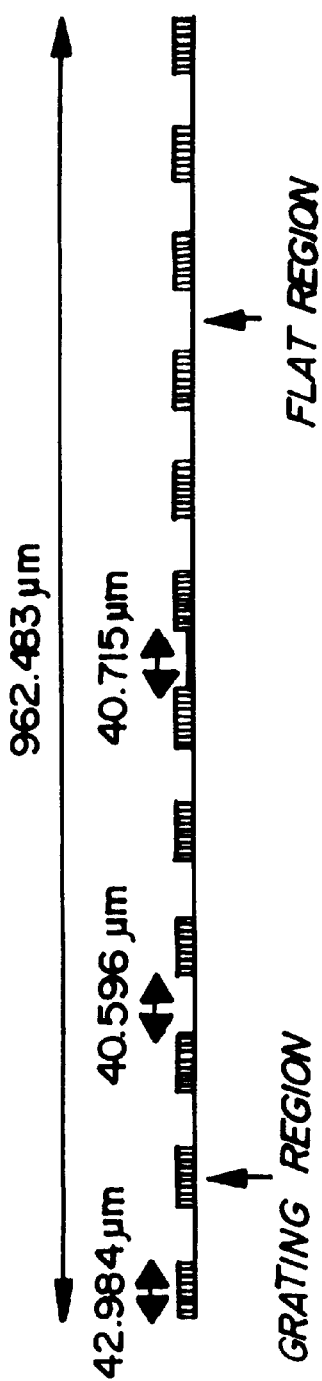
FIGS. 5a and 5b show the overall grating structure, and the detailed structure of a single grating section of the ILFP respectively.
Figure 5B:
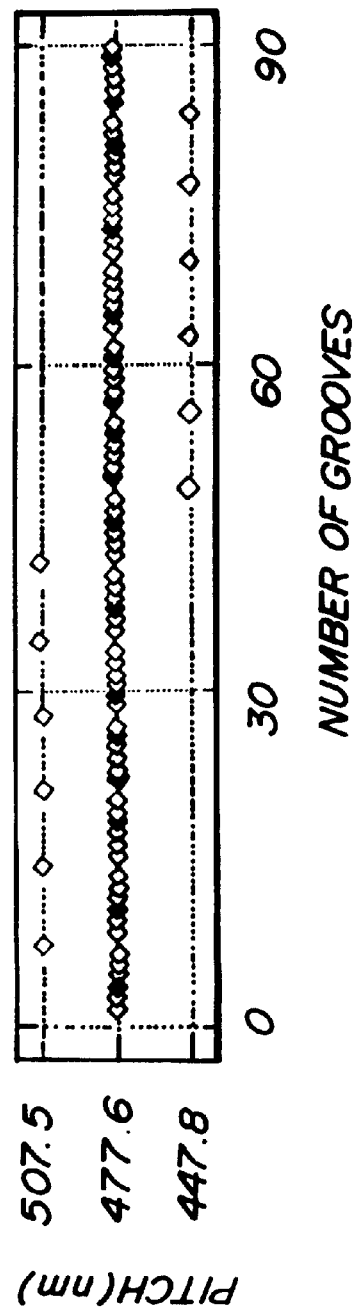

In this example, the grating structure used for the ILFP laser has twelve grating regions and 11 flat regions. The configuration of the gratings is shown in FIG. 5. The filter has a quasi-chirped grating of period 477.6 nm with twelve λ/16 phase-shifts. The flat region in the middle of the laser cavity is 0.119 μm longer that the other flat regions to give a central π phase-shift.

Figure 6:
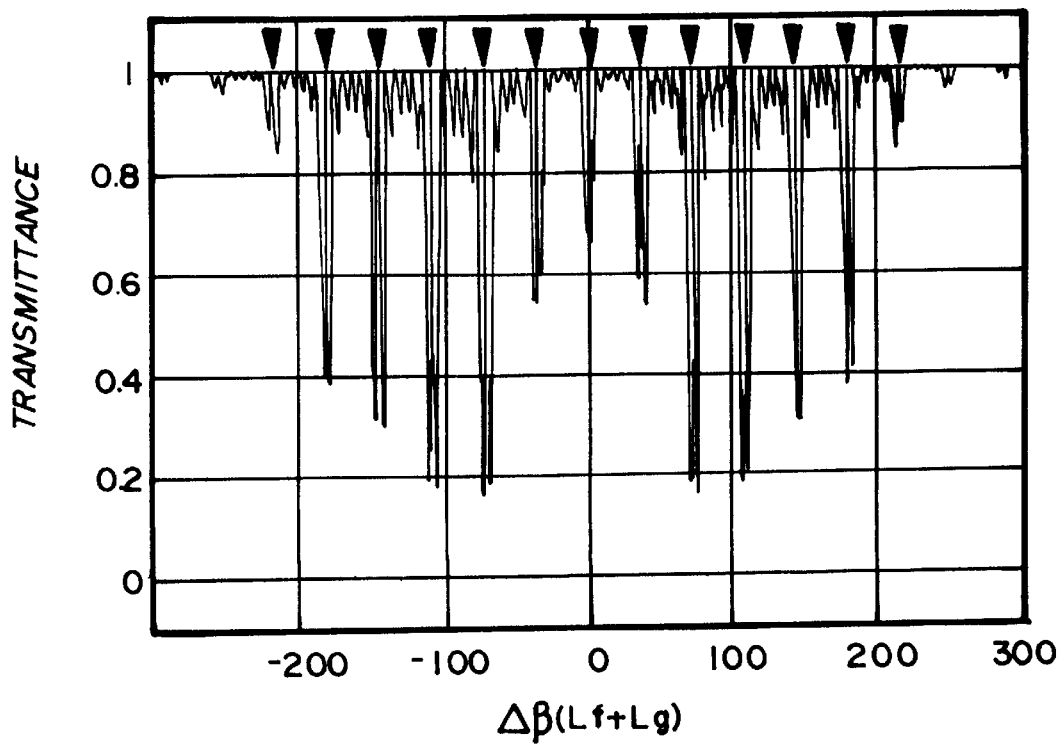
FIG. 6 shows the calculated transmission spectrum of a cascaded ILFP grating as a function of the normalised wavenumber deviation from the Bragg condition.

FIG. 6 shows the calculated transmission spectrum of the cascaded ILFP filter as a function of the normalised wave number deviation from the Bragg condition. Thirteen sharp equally spaced peaks are obtained. Each peak has a response similar to that of a quarter-wavelength-shifted DFB laser. The normalised coupling coefficient $kL_g$ ($L_g$ is the total length of the grating regions) is assumed to be 4.0. To obtain the 4 nm-spaced modes a total cavity length of 963 μm was used. Five ripples are observed between each 4 nm spaced peak, however the threshold gain of the ripples is much higher than that of the sharp peaks and this prevents them from lasing.

Figure 7:
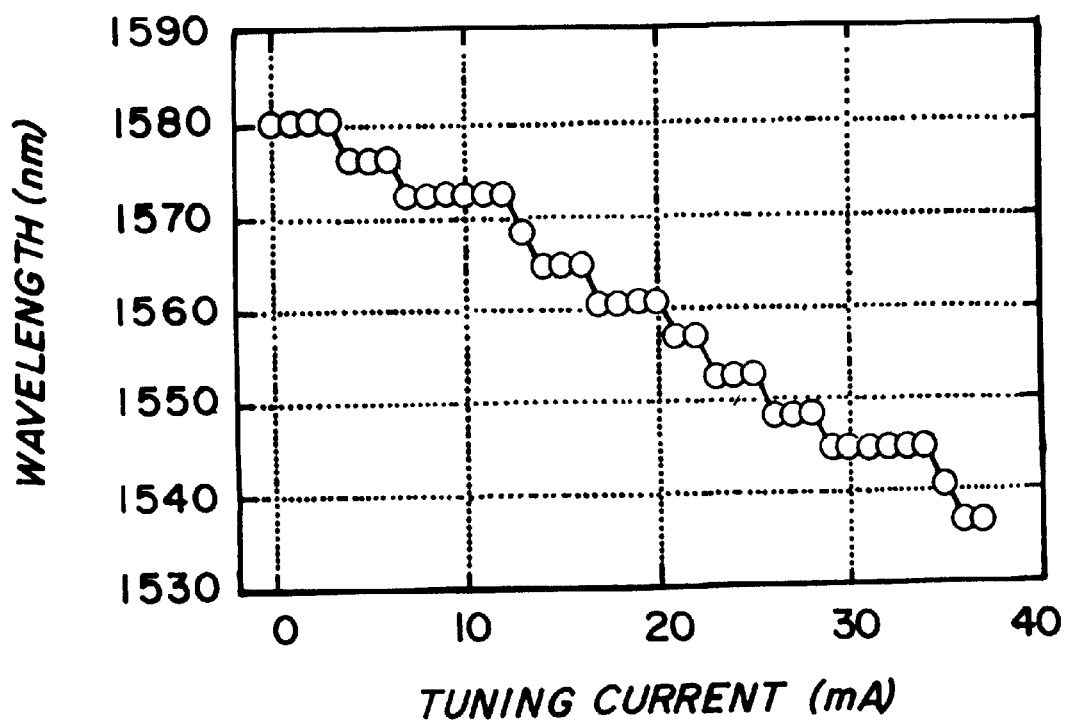
FIG. 7 shows the output wavelength of the laser as a function of the tuning current into the co-directional coupled filter section.

In use, wavelength tuning is obtained by current injection into the GAVCF section of the device. FIG. 7 shows the wavelength as a function of tuning current for a constant ILFP current of 90 mA. Twelve different longitudinal modes can be accessed giving a 44 nm tuning range. The peak power of the main mode decreases from 3.6 dBm to −7.1 dBm during tuning due to increased free-carrier loss. Stable single-mode operation with an SMSR of better than 25 dB is obtained for each mode in the 44-nm tuning range. No lasing is observed at the wavelengths between the desired 4 nm-spaced peaks.

The GAVCF of this embodiment differs from conventional GAVCF devices in that the GAVCF grating 450 is formed by altering the width of the upper high-index) guide 45. This allows the grating to be formed at the same time as the guide itself, thereby reducing fabrication complexity and increasing drive yield. The coupling length of the GAVCF was calculated itself using the eigenmode matching and propagation (EMP) method [H. P. Nolting and G. Szefka, "Eigenmode matching and propagation theory of square meander-type couplers", IEEE photon. Tech. Lett., 1992,4 (12), pp 1386–1389. The two-dimensional filed profiles and guided mode indices required by the EMP method were calculated using a vectorial finite difference program. The chosen structure used a 0.4 μm thick 1.3 μm wavelength quaternary upper guide with mesa widths of 1.7 μm to 2.0 μm formed the material grating. This upper guide was separated by 1.5 μm of InP from a 0.1 μm thick, 4 μm wide 1.1 μm-wavelength quaternary lower guide. Using this structure, it was calculated that a 77-period grating (grating period 19.05 μm) with a coupling length of 1467 μm was required to obtain total mode transfer. The FWHM of the filter response of this structure was calculated to be approximately 4 nm. Since the upper guide was multi-moded, the width was adiabatically tapered down to 1.0 μm before it reached the evanescently coupled active layer of the device to ensure that only the lowest order transverse mode is excited. The upper guide was removed in the window section at the rear of the device to suppress the reflection of unfiltered light from the active layer.

Figure 8:
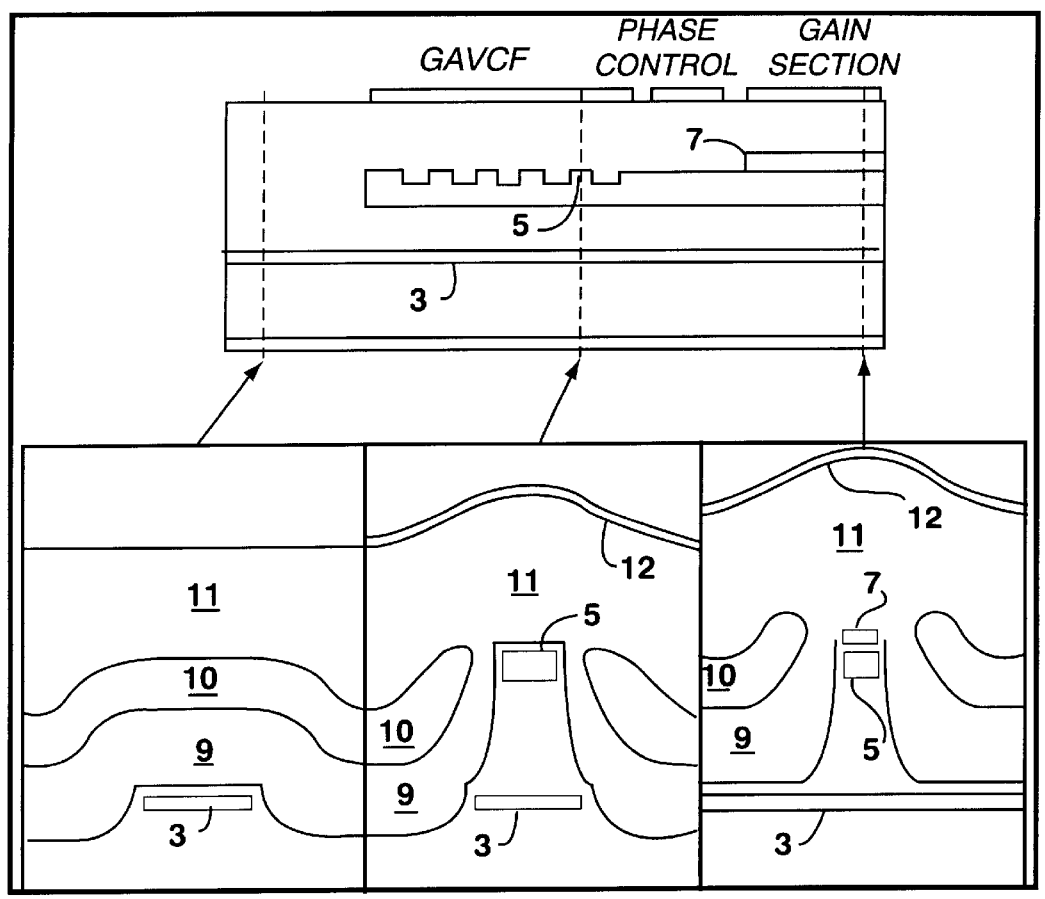
FIG. 8 is a schematic and sectional view of the laser.
Figure 9:
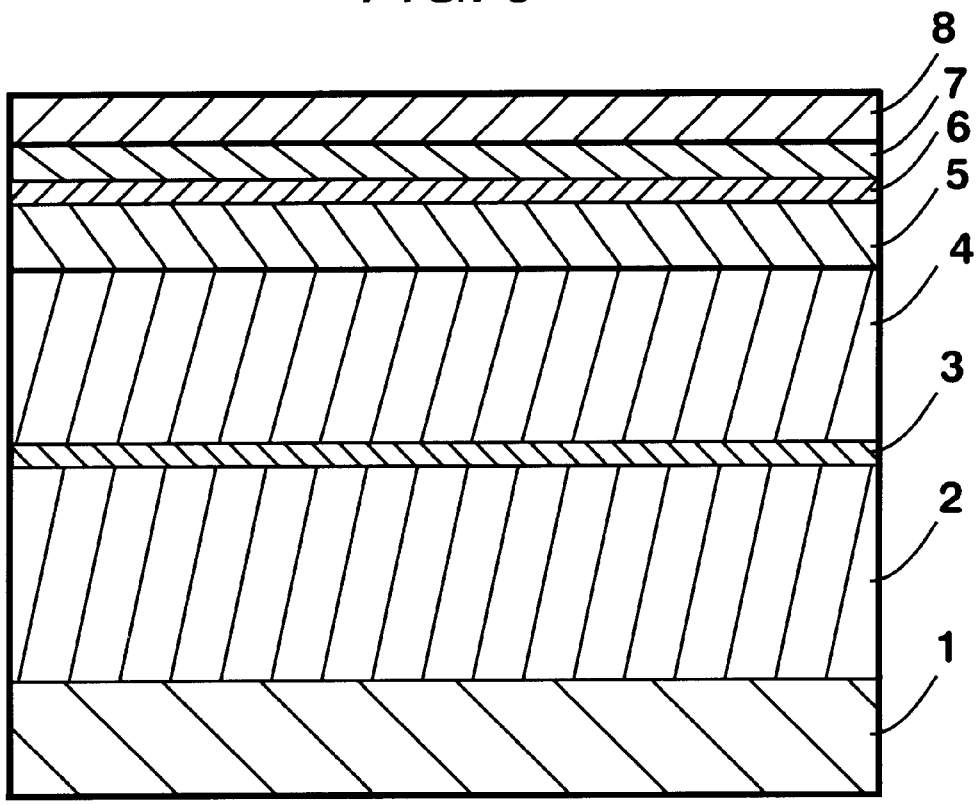
FIG. 9 is a cross-sectional view of the planar structure used to form the laser.

The fabrication of the tunable laser will now be described with reference to FIGS. 8 and 9. The fabricated device has a 1000 μm long gain section, a 200 μm taper selection and 1800 μm combined GAVCF and window region. Three grating periods (18.5 μm, 19.0 μm, and 19.5 μm) were used in the GAVCF region to allow for calculation and fabrication tolerances.

The material used for this device was epitaxially grown on an S doped InP substrate 1 using atmospheric pressure MOVPE. The planar consisted of, (FIG. 9) a 2 μm thick S doped InP buffer 2, a 0.1 μm thick S doped lower guide layer composed of 1.1 μm wavelength InGaAsP 3; a 1.5 μm S doped InP spacer layer 4; a 0.4 μm thick undoped upper guide composed of 1.3 μm wavelength InGaAsP 5; a 0.05 μm thick S doped InP spacer layer 6; an 8 well strained MQW active layer with an emission wavelength of approximately 1.57 μm 7; and a 0.2 μm thick Zn doped 1.3 μm wavelength InGaAsP grating layer 8.

The first step of the fabrication process for the device including the in-line-Fabry Perot (ILFP) is the definition of the grating by E-beam lithography. (For the device without this section this step is missed out, but other than this the processing is identical). Once the grating has been defined the active region is removed from regions of the device where it is not required, i.e. the GAVCF. This is achieved by first defining an oxide mask over the active part of the device. The unprotected material is then removed using dry etching to etch through the short wavelength quaternary grating layer (or InP in the device without the ILFP), followed by a selective wet chemical etch that attacks the quaternary active layer, while not etching the underlying InP spacer layer. The first oxide mask is removed and a new one deposited. This is then used to define a 4 μm wide stripe that will define the lower guide when the upper guide is formed at the next stage. The mask is used to allow underlying material to be etched to a depth of 0.6 μm. In the active region of the device this guide wide is increased to 100 μm to scatter light of unwanted wavelengths. The oxide mask is again removed and a new layer deposited. This is used to define the upper mesa containing the novel laterally etched vertical coupler filter grating. The use of a laterally etched grating removes the need for a separate layer for the VCF grating, and removes the need for an additional level of photolithography to define it. This reduces fabrication complexity and therefore increases the potential device yield.

The patterned oxide mask is then used to dry etch the underlying semiconductor to a depth of 1.65 μm to define the high index upper guide in the thick 1.3 μm quaternary guide. At the same time the step etched at the previous stage is transferred down to form the weaker lower guide in the thin 1.1 μm quaternary guide. The upper guide is not continuous along the entire length of the device but is truncated approximately 250 μm from the front facet of the device so that only the desired filtered wavelength is reflected from the front facet of the device. The double mesa structure is then overgrown to form a buried structure (In our device a two stage overgrowth is performed to define a buried heterostructure device. Amongst other alternative approaches, it is possible to form a Buried Ridge device using a single overgrowth step if so desired). In the first stage overgrowth a reverse biased p-n junction current blocking layer is grown, consisting of a 0.8 µm Zn-doped layer 9 followed by a 0.6 µm S-doped layer 10 (A semi-insulating Fe-doped overgrowth could also be employed to replace layers 9 & 10). The oxide mask is then removed and a second overgrowth performed. This consists of 2.5 µm of Zn-doped InP (11), followed by a 0.1 µm highly Zn-doped (>e19 cm-3) InGaAs contract layer (12). Another oxide mask is then deposited and patterned to form contact regions on the various regions of the device, i.e. the GAVCF tuning section, the active region and phase control region.

The oxide mask is again removed and a new layer deposited. This is used to define a trench on either side of the overgrown guides. The trenches are spaced by approximately 30 µm, and are etched to a depth of approximately 4.5 µm. The trenches are used to reduce capacitance and increase the isolation resistance between the different sections of the device.

The oxide mask is again removed and a final layer of oxide deposited. This is used to define contact windows over the ternary mesas previously defined, while preventing contact from being formed in areas of the chip where it is not required. A TiAu p side metallisation is deposited and patterned to form separate contacts on the different regions of the device. The substrate is thinned to approximately 100 µm, and TiAu metallisation deposited on the n side of the device. The device slice is then cleaved into individual devices. FIG. 8 shows a schematic diagram of the device with cross sections of the guide geometry at various points.

Although the above examples use a lateral-grating GAVCF and an in-line FP in combination, neither of these aspects of the invention are limited to use in this manner and both may be used independently of each other. For example, the lateral-grating GAVCF structure may be used interposed between a conventional gain section and a rear-reflector formed from a conventional sampled grating. As another example, a tunable laser may be formed using the combination of a super-structure grating (SSG) to provide the tuning, and an ILFP laser to provide the optical source. A GAVCF may be used with a rear SSG, in which case the SSG provides a comb of reflected peaks. As a further alternative, an ILFP may be combined with a SSG. In this case both the ILFP and SSG produce a respective comb response. By injecting current into the passive region of the ILFP the system may be tuned using the Vernier effect.

What is claimed is:

1. An optical filter comprising at least two gratings located in a waveguide region of a semiconductor optical device, each grating having a pitch which changes linearly from a start period to an end period; the grating periods of at least two gratings increasing in the same direction, and the gratings being spaced apart in the waveguide region, each grating have a multiple peak optical passband and the gratings forming an optical cavity having a transmission comb-filter characteristic.

2. A filter according to claim 1, in which the semiconductor optical device includes an optical gain element and the gratings are spaced apart within a single continuous active region of the optical gain element.

3. A filter according to claim 1, in which the semiconductor optical device includes a passive tunable optical element, and the gratings are spaced apart within a single continuous waveguide region of the optical element.

4. A filter according to claim 1, in which the gratings are superstructure gratings (SSG's).

5. A filter according to claim 1, in which the gratings are sampled gratings.

6. A tuneable semiconductor laser incorporating a filter according to claim 1 in an optical cavity of the laser.

7. A laser according to claim 6 comprising a GAVCF coupled in series with the said filter or filter system.

8. A laser according to claim 6 comprising a grating-assisted vertically-coupled filter (GAVCF) comprising a first waveguide region, a second waveguide region aligned with the first waveguide region and spaced apart from the first waveguide region in a first direction, and a grating associated with the second waveguide region, characterised in that the said grating is provided by a periodic variation in the width of the second waveguide in the plane normal to the said first direction.

9. A tuneable semiconductor laser incorporating a filter comprising at least two gratings located in a waveguide region of the tuneable semiconductor laser, each grating having a multiple peak optical passband and the gratings being spaced apart in the waveguide region and forming an optical cavity having a transmission comb-filter characteristic.

10. A filter system comprising a plurality of filters coupled in series along the waveguide region of a semiconductor optical device with a phase discontinuity at the interface between the filters, wherein each filter comprises at least two gratings located in the waveguide region of the semiconductor optical device, each grating having a multiple peak optical passband and the gratings being spaced apart in the waveguide region and forming an optical cavity having a transmission comb-filter characteristic.

11. A filter system according to claim 10, in which the semiconductor optical device includes an optical gain element and the gratings are spaced apart within a single continuous active region of the optical gain element.

12. A filter system according to claim 10, in which the semiconductor optical device includes a passive tunable optical element, and the gratings are spaced apart within a single continuous waveguide region of the optical element.

13. A filter system according to claim 10, in which the gratings are superstructure gratings (SSG's).

14. A filter system according to claim 10, in which the gratings are sampled gratings.

15. A filter system according to claim 10, in which the grating is an irregular computer-generated grating.

16. A filter system according to claim 10, in which the plurality of filters are arranged symmetrically about a central region of the waveguide and there is a phase shift of pi at the interface between the waveguides at the said central region.

17. A method of filtering an optical signal, characterised by passing the signal through a waveguide region of a semiconductor optical device, the waveguide region including at least two gratings which are spaced apart in the waveguide region and which form an optical cavity, each grating having a pitch which changes linearly from a start period to an end period, the grating periods of the at least two gratings increasing in the same direction and each grating having a multiple peak optical passband; and imposing on the optical signal in the optical cavity a transmission comb-filter characteristic.

18. An optical filter characterised by at least two gratings located in a waveguide region of a semiconductor optical device, each grating having a pitch which changes linearly from a start period to an end period, the grating periods of the at least two gratings increasing in the same direction, and the gratings being spaced apart in the waveguide region, each grating having a multiple peak optical passband and the grating forming an optical cavity having a comb-filter characteristic.

* * * * *